US012685211B2

(12) United States Patent　　　　(10) Patent No.:　US 12,685,211 B2
Tsai et al.　　　　　　　　　　　　(45) Date of Patent:　　　Jul. 14, 2026

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Fang-Lin Tsai, Taichung City (TW); Wei-Son Tsai, Taichung City (TW); Kun-Yuan Luo, Taichung City (TW); Pei-Geng Weng, Taichung City (TW); Sheng-Hua Yang, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 368 days.

(21) Appl. No.: 18/327,097

(22) Filed: Jun. 1, 2023

(65) Prior Publication Data

US 2024/0282655 A1　　Aug. 22, 2024

(30) Foreign Application Priority Data

Feb. 21, 2023　　(TW) ................................. 112106316

(51) Int. Cl.
　　*H10W 74/10*　　　(2026.01)
　　*H10W 70/09*　　　(2026.01)
　　*H10W 70/60*　　　(2026.01)
　　*H10W 70/652*　　(2026.01)
　　*H10W 72/00*　　　(2026.01)
　　*H10W 90/00*　　　(2026.01)
(52) U.S. Cl.
　　CPC ........ *H10W 74/121* (2026.01); *H10W 74/117* (2026.01); *H10W 70/09* (2026.01); *H10W*

*70/60* (2026.01); *H10W 70/6528* (2026.01); *H10W 72/07307* (2026.01); *H10W 90/736* (2026.01)

(58) Field of Classification Search
CPC . H01L 23/3135; H01L 23/3128; H01L 24/19; H01L 24/20; H01L 24/32; H01L 24/83; H01L 2224/19; H01L 2224/214; H01L 2224/215; H01L 2224/32245; H01L 2224/83005; H01L 2924/01029; H10W 74/121; H10W 74/117; H10W 72/07307; H10W 70/6528; H10W 70/09; H10W 70/60; H10W 90/736
See application file for complete search history.

(56) References Cited

U.S. PATENT DOCUMENTS

2016/0379965 A1*　12/2016　Chen ........................ H01L 24/20
　　　　　　　　　　　　　　　　　　　438/107
2019/0206824 A1*　7/2019　Lu ............................ H01L 24/20
(Continued)

*Primary Examiner* — Jacob Y Choi
*Assistant Examiner* — Neil R Prasad
(74) *Attorney, Agent, or Firm* — Dority & Manning, PA

(57) ABSTRACT
An electronic package and a manufacturing method thereof are provided, in which an electronic element is pasted on a routing layer that is configured with a plurality of conductive pillars, then the electronic element, the conductive pillars and the routing layer are covered with a cladding layer, and a circuit structure electrically connected to the electronic element and the conductive pillars is formed on the cladding layer. Therefore, the conductive pillars can be directly formed on the routing layer and the dielectric layer is omitted, so there is no need to consider the thickness of the dielectric layer, so as to facilitate the thinning of the electronic package.

10 Claims, 7 Drawing Sheets

(56) References Cited

U.S. PATENT DOCUMENTS

| 2022/0392855 | A1* | 12/2022 | Darmawikarta | ........ | H01L 25/16 |
| 2023/0197661 | A1* | 6/2023 | Darmawikarta | ........ | H01L 25/18 |
| | | | | | 257/770 |
| 2024/0128148 | A1* | 4/2024 | Hsueh | ................ | H01L 21/6835 |

* cited by examiner

ELECTRONIC PACKAGE AND MANUFACTURING METHOD THEREOF

BACKGROUND

1. Technical Field

The present disclosure relates to a semiconductor packaging process, and more particularly, to an electronic package and a manufacturing method thereof.

2. Description of Related Art

Technologies currently used in the field of chip packaging include, for example, chip scale package (CSP), direct chip attached (DCA), or multi-chip module (MCM) and other flip-chip packaging modules, or stacking technology such as integrating the three-dimensional stacking of chips into three-dimensional integrated circuit (3D IC) chip stacking or PoP (Package on Package) packaging stacking, and the like.

FIG. 1A to FIG. 1G are schematic cross-sectional views illustrating a manufacturing method of a conventional semiconductor package 1.

As shown in FIG. 1A, a routing layer 10 (e.g., a wiring layer) is formed on a carrier board 9, and then the routing layer 10 is covered with a dielectric layer 16 made of such as polyimide (PI), and the dielectric layer 16 is formed with a plurality of opening regions 160 by patterning, exposure and development, so that parts of the surface of the routing layer 10 are exposed from the opening regions 160, wherein the carrier board 9 is, for example, a circular board body made of semiconductor material, on which a release layer 90 and a bonding layer 91 made of such as PI are sequentially formed by coating, so as to bond the routing layer 10 and the dielectric layer 16 onto the bonding layer 91.

As shown in FIG. 1B, a plurality of conductive pillars 14 such as copper pillars are formed on the routing layer 10 in the opening regions 160.

As shown in FIG. 1C, at least one semiconductor chip 13 is disposed on the dielectric layer 16, wherein the semiconductor chip 13 has an active surface 13a and an inactive surface 13b opposing the active surface 13a, the semiconductor chip 13 is adhered and fixed on the dielectric layer 16 with the inactive surface 13b thereof by an adhesive 133, and a plurality of electrode pads 130 bonded to copper bumps 132 are formed on the active surface 13a, and an insulating layer 131 can be formed on the active surface 13a according to requirements, so that the insulating layer 131 covers the electrode pads 130 and the copper bumps 132.

As shown in FIG. 1D, a cladding layer 15 is formed on the dielectric layer 16, so that the cladding layer 15 covers the semiconductor chip 13, the insulating layer 131 (or the copper bumps 132) and the conductive pillars 14, and then an upper surface of the cladding layer 15 is flush with an upper surface of the insulating layer 131, end surfaces of the conductive pillars 14 and end surfaces of the copper bumps 132 via a leveling process, so that the upper surface of the insulating layer 131, the end surfaces of the conductive pillars 14 and the end surfaces of the copper bumps 132 are exposed from the cladding layer 15.

As shown in FIG. 1E, a circuit structure 19 is formed on the cladding layer 15, and the circuit structure 19 is electrically connected to the conductive pillars 14 and the copper bumps 132, so that the semiconductor chip 13 is electrically connected to the circuit structure 19 via the copper bumps 132.

The circuit structure 19 includes a plurality of dielectric layers 190 and a plurality of circuit layers 191 formed on the dielectric layers 190, and the outermost dielectric layer 190 can be used as a solder-resist layer, so that the outermost circuit layer 191 is exposed from the solder-resist layer for bonding a plurality of solder balls 17 onto the outermost circuit layer 191, so as to be connected to an electronic device such as a circuit board (not shown) later.

As shown in FIG. 1F, the carrier board 9 and the release layer 90 and the bonding layer 91 thereon are removed to expose the dielectric layer 16.

As shown in FIG. 1G, a solder-resist layer 18 made of a solder mask (e.g., green paint) is formed on the dielectric layer 16, and the solder-resist layer 18 is formed with a plurality of openings 180, so that parts of the surface of the routing layer 10 are exposed from the openings 180.

However, in the conventional semiconductor package 1, before forming the dielectric layer 16, it is necessary to carry out surface treatment operation (such as roughening process) on the surface of the routing layer 10 to increase the adhesion between the routing layer 10 and the dielectric layer 16, resulting in a cumbersome manufacturing process, which makes it difficult to reduce the production cost of the semiconductor package 1.

Furthermore, the manufacturing method of the conventional semiconductor package 1 needs to form the dielectric layer 16 made of PI material on the bonding layer 91. Therefore, the dielectric layer 16 needs to be baked, thereby greatly increasing the process time, making it difficult to increase the throughput of the semiconductor package 1.

Also, the manufacturing method of the conventional semiconductor package 1 needs to form the opening regions 160 in the dielectric layer 16 by patterning, exposure and development, which not only greatly increases the number of times of using the exposure machine to make the opening regions 160, thereby increasing the wear and tear of the exposure machine, but also must consider the cost of the photomask for exposing the PI material. Therefore, it is difficult to reduce the manufacturing cost of the semiconductor package 1.

In addition, the manufacturing method of the conventional semiconductor package 1 needs to form the dielectric layer 16 made of PI material on the bonding layer 91. Therefore, the final overall thickness of the conventional semiconductor package 1 needs to consider the thickness of the dielectric layer 16, so it is difficult to reduce the final overall thickness of the semiconductor package 1, and it is difficult to meet the thinning requirement.

What is more, because the material of the cladding layer 15 and the material of the dielectric layer 16 are different, the coefficient of thermal expansion (CTE) of the cladding layer 15 and the CTE of the dielectric layer 16 do not match (mismatch), and thus uneven thermal stress is prone to occur. During a thermal cycle, the semiconductor package 1 is warped, so that the solder balls 17 cannot be effectively aligned with and bonded to the contacts of the circuit board in subsequent processes.

Therefore, how to overcome various problems of the above-mentioned prior art has become an urgent problem to be solved at present.

SUMMARY

In view of the above-mentioned deficiencies in the prior art, the present disclosure provides an electronic package, comprising: a cladding layer having a first surface and a second surface opposing the first surface; a routing layer embedded in the first surface of the cladding layer, wherein the routing layer has an outer surface that is flush with the first surface of the cladding layer; a plurality of conductive pillars in contact with and bonded on the routing layer and embedded in the cladding layer; an electronic element disposed on the routing layer via an adhesive layer and embedded in the cladding layer; and a circuit structure disposed on the second surface of the cladding layer and electrically connected to the electronic element and the conductive pillars.

The present disclosure also provides a method of manufacturing an electronic package, the method comprising: forming a routing layer on parts of a surface of a carrier board; forming a plurality of conductive pillars on the routing layer, and disposing an electronic element on the routing layer; forming a cladding layer on the carrier board, wherein the routing layer, the electronic element and the plurality of conductive pillars are covered by the cladding layer, wherein the cladding layer has a first surface and a second surface opposing the first surface, and the cladding layer is bonded to the carrier board with the first surface; forming a circuit structure on the second surface of the cladding layer, wherein the circuit structure is electrically connected to the plurality of conductive pillars and the electronic element; and removing the carrier board to expose the first surface of the cladding layer and the routing layer.

In the aforementioned electronic package and method, the electronic element has an active surface and an inactive surface opposing the active surface, the electronic element is bonded on the routing layer with the inactive surface via the adhesive layer, and a plurality of electrode pads are formed on the active surface, such that the circuit structure is electrically connected to the plurality of electrode pads. For example, the present disclosure further comprises forming a plurality of conductors on the plurality of electrode pads, wherein the plurality of electrode pads are electrically connected to the circuit structure via the plurality of conductors. Further, end surfaces of the plurality of conductors are flush with the second surface of the cladding layer.

In the aforementioned electronic package and method, end surfaces of the plurality of conductive pillars are flush with the second surface of the cladding layer.

In the aforementioned electronic package and method, the present disclosure further comprises forming a plurality of conductive elements on the circuit structure, wherein the plurality of conductive elements are electrically connected to the circuit structure.

In the aforementioned electronic package and method, the present disclosure further comprises forming an insulating protection layer on the first surface of the cladding layer and the routing layer, wherein the insulating protection layer has a plurality of openings, and parts of a surface of the routing layer are exposed from the plurality of openings.

It can be seen from the above that in the electronic package and the manufacturing method thereof of the present disclosure, the conductive pillars are directly formed on the routing layer, so there is no need to perform surface treatment operation on the surface of the routing layer, that is, there is no need to carry out conventional processes for increasing the adhesion between the routing layer and the dielectric layer. Therefore, compared with the prior art, the manufacturing method of the present disclosure can simplify the manufacturing process, so as to reduce the manufacturing cost of the electronic package.

Furthermore, the manufacturing method of the present disclosure can save the conventional baking time of the dielectric layer because there is no need to form a conventional PI material dielectric layer on the carrier board. Therefore, compared with the prior art, the manufacturing method of the present disclosure can increase the throughput of manufacturing the electronic package.

Also, the manufacturing method of the present disclosure does not need to form opening regions because it does not need to form a conventional PI material dielectric layer on the carrier board. Therefore, compared with the prior art, the manufacturing method of the present disclosure can not only reduce the number of times of using the exposure machine used to make the opening regions, so as to reduce the wear and tear of the exposure machine, but also can reduce the cost of the photomask used for exposing the dielectric material, so as to reduce the manufacturing cost of the electronic package.

In addition, the manufacturing method of the present disclosure does not need to form a conventional PI material dielectric layer on the carrier board. Therefore, compared with the prior art, the final overall thickness of the electronic package of the present disclosure can be greatly reduced to meet the requirement of thinning.

Further, the manufacturing method of the present disclosure does not need to form a conventional PI material dielectric layer on the carrier board, so that the cladding layer directly covers and contacts the routing layer. Therefore, compared with the prior art, the problem of CTE mismatch can be prevented from happening in the cladding layer, and thus the occurrence of uneven thermal stress can be avoided. Accordingly, during the thermal cycle, the electronic package will not warp, so that the conductive elements can be effectively aligned with and bonded to the contacts of the electronic device in subsequent processes.

DETAILED DESCRIPTION

The following describes the implementation of the present disclosure with examples. Those skilled in the art can easily understand other advantages and effects of the present disclosure from the content disclosed in this specification.

It should be understood that, the structures, ratios, sizes, and the like in the accompanying figures are used for illustrative purposes to facilitate the perusal and comprehension of the content disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical content disclosed in the present specification. Meanwhile, terms such as "upper," "on," "first," "second," "a," "one" and the like used herein are merely used for clear explanation rather than limiting the practicable scope of the present disclosure, and thus, alterations or adjustments of the relative relationships thereof without essentially altering the technical content should still be considered in the practicable scope of the present disclosure.

FIG. 2A to FIG. 2G are schematic cross-sectional views illustrating a manufacturing method of an electronic package 2 according to the present disclosure.

Figure 1A:
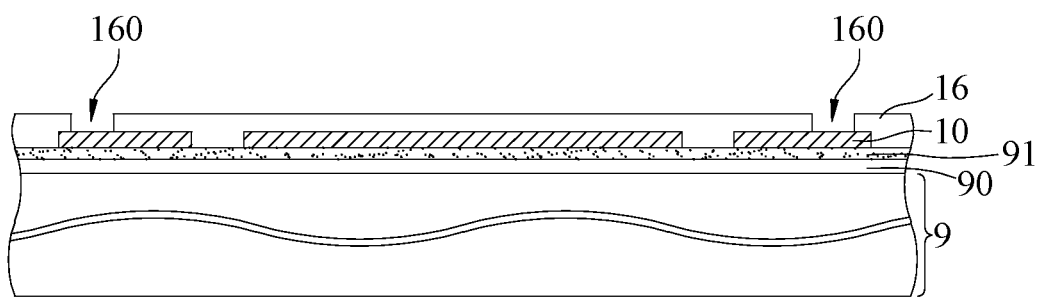
FIG. 1A to FIG. 1G are schematic cross-sectional views illustrating a manufacturing method of a conventional semiconductor package.
Figure 1B:
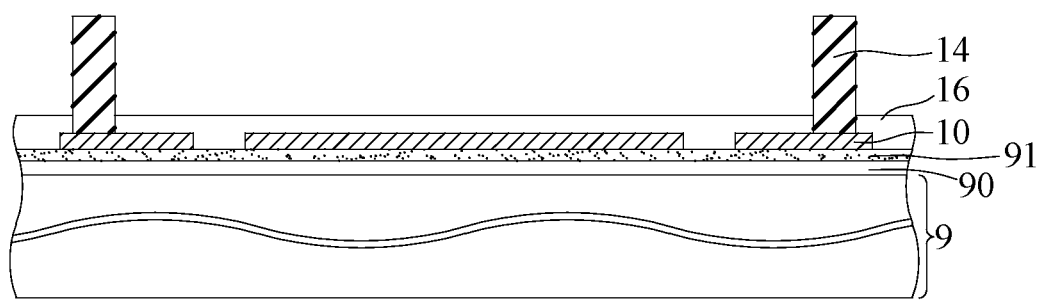
Figure 1C:
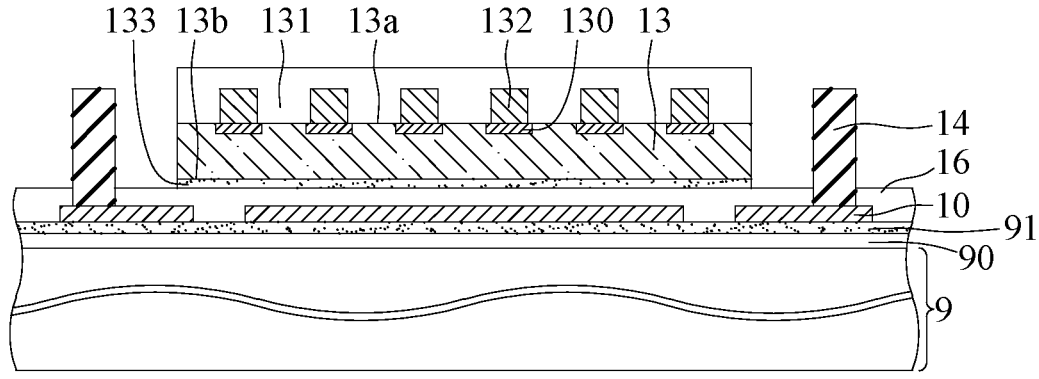
Figure 1D:
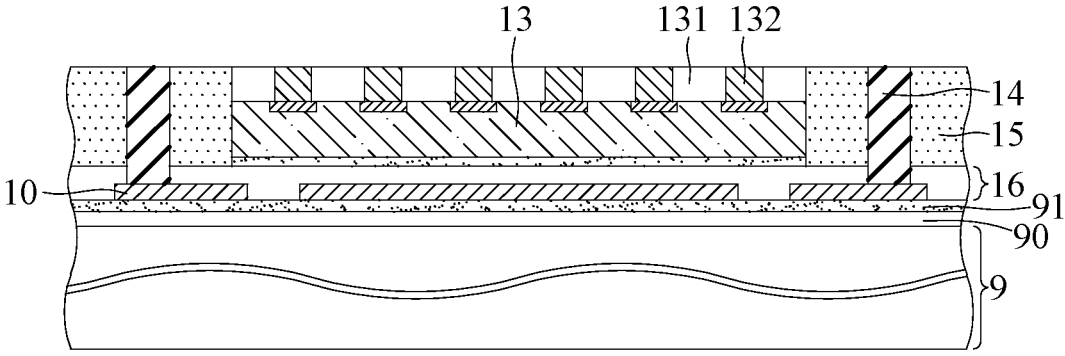
Figure 1E:
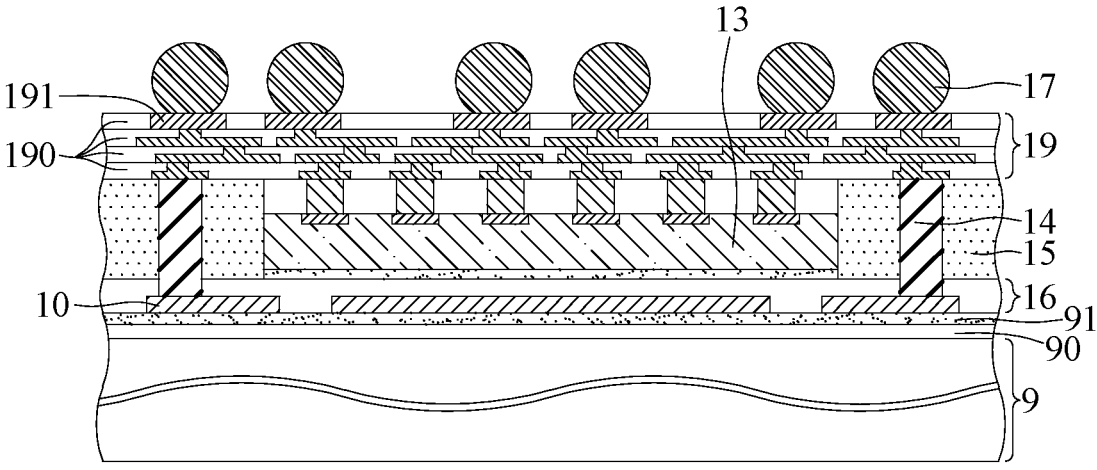
Figure 1F:
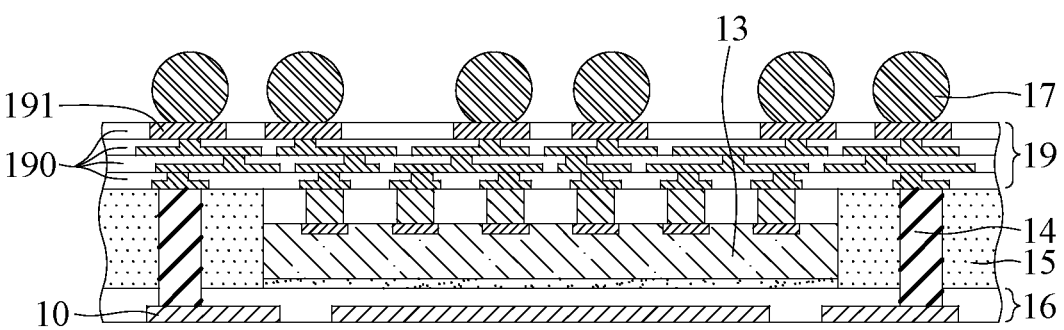
Figure 1G:
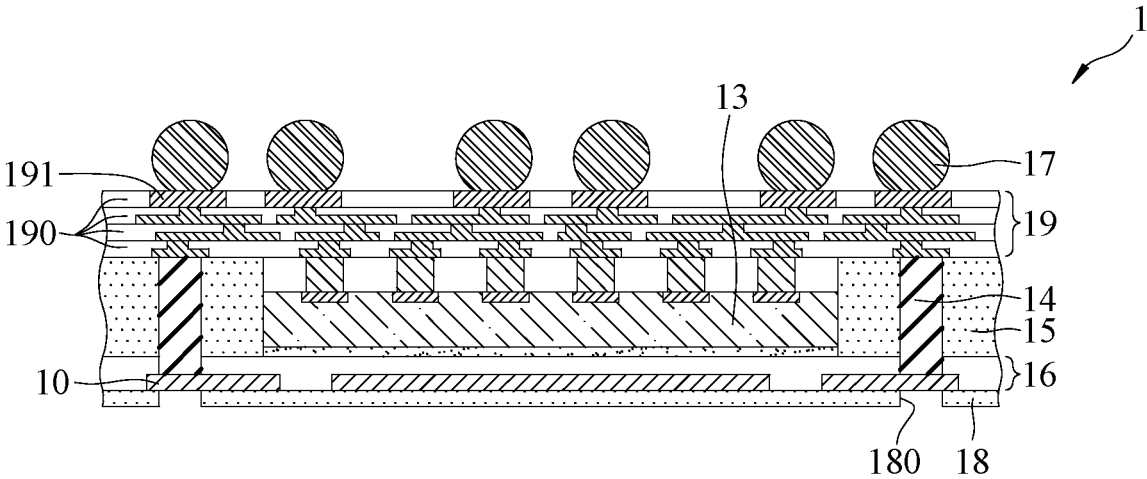
Figure 2A:
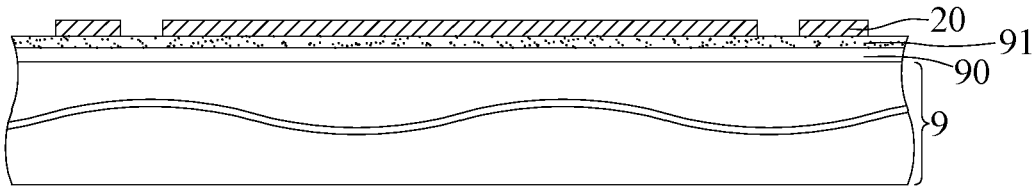
FIG. 2A to FIG. 2G are schematic cross-sectional views illustrating a manufacturing method of an electronic package according to the present disclosure.

As shown in FIG. 2A, a routing layer 20 (e.g., a wiring layer) is formed on parts of the surface of a carrier board 9 by patterning and electroplating copper.

In an embodiment, the carrier board 9 is, for example, a circular board body made of semiconductor material, on which a release layer 90 and a bonding layer 91 made of such as polyimide (PI) are sequentially formed by coating, so that the routing layer 20 is formed on parts of the surface of the bonding layer 91.

Figure 2B:
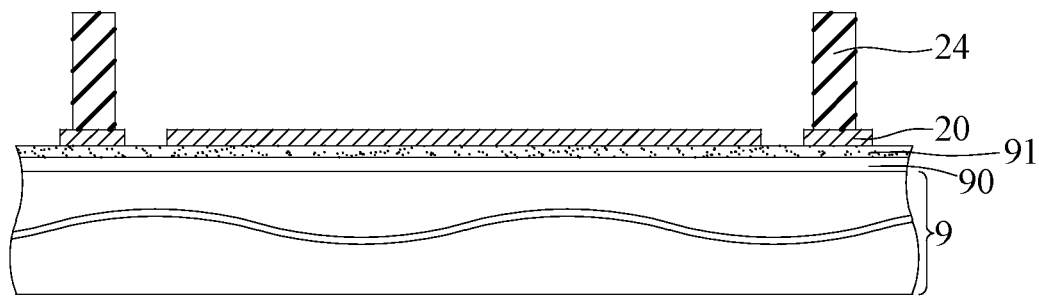

As shown in FIG. 2B, a plurality of conductive pillars 24 are formed on the routing layer 20.

In an embodiment, the conductive pillars 24 are metal pillars such as copper pillars or pillar-like solder material. For instance, the conductive pillars 24 are formed by electroplating copper, but the present disclosure is not limited to as such.

Figure 2C:
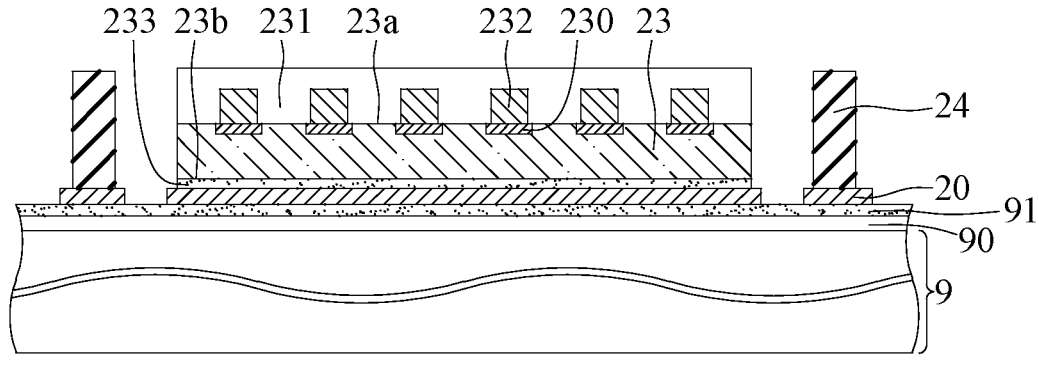

As shown in FIG. 2C, at least one electronic element 23 is disposed on the routing layer 20, and a plurality of conductors 232 are bonded on and electrically connected to the electronic element 23.

In an embodiment, the electronic element 23 is an active element, a passive element, or a combination of the active element and the passive element, wherein the active element is such as a semiconductor chip, and the passive element is such as a resistor, a capacitor, or an inductor. For example, the electronic element 23 is a semiconductor chip and has an active surface 23a and an inactive surface 23b opposing the active surface 23a, wherein the electronic element 23 is adhered and fixed on the routing layer 20 with the inactive surface 23b thereof via an adhesive layer 233 such as glue, and a plurality of electrode pads 230 are formed on the active surface 23a, so that the conductors 232 are formed on the electrode pads 230.

Moreover, the conductor 232 is a spherical shape such as a solder ball, or a pillar shape of metal materials such as copper pillars and solder bumps, or a stud made by a wire-bonding machine, but the present disclosure is not limited thereto.

Furthermore, an insulating layer 231 can be formed on the active surface 23a according to requirements, so that the insulating layer 231 covers the electrode pads 230 and the conductors 232. Alternatively, the conductors 232 can also be exposed from the insulating layer 231.

Figure 2D:
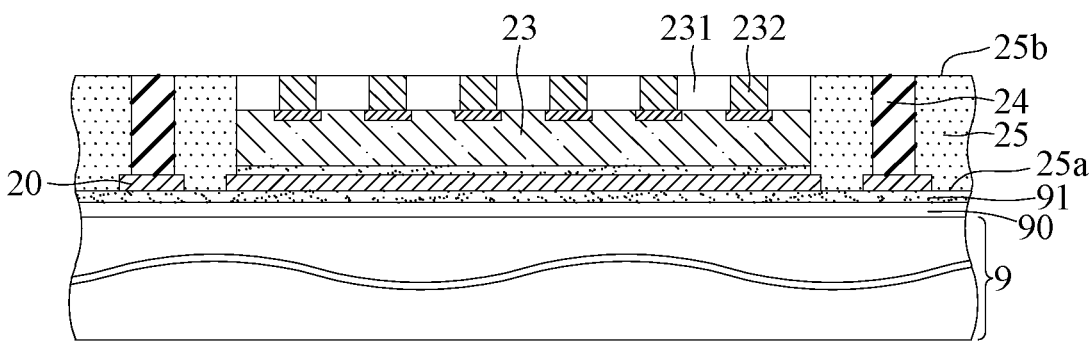

As shown in FIG. 2D, a cladding layer 25 is formed on the bonding layer 91, so that the cladding layer 25 covers the routing layer 20, the electronic element 23, the insulating layer 231 (or the conductors 232) and the conductive pillars 24, wherein the cladding layer 25 has a first surface 25a and a second surface 25b opposing the first surface 25a, so that the cladding layer 25 is bonded to the bonding layer 91 with the first surface 25a thereof.

In an embodiment, the material for forming the cladding layer 25 is an insulating material such as polyimide (PI), dry film, epoxy resin, or molding compound, but is not limited thereto. For example, the cladding layer 25 can be formed on the bonding layer 91 by lamination or molding.

Moreover, via the leveling process, the second surface 25b of the cladding layer 25 is flush with the upper surface of the insulating layer 231, the end surfaces of the conductive pillars 24 and the end surfaces of the conductors 232, so that the upper surface of the insulating layer 231, the end surfaces of the conductive pillars 24 and the end surfaces of the conductors 232 are exposed from the cladding layer 25. For example, the leveling process is to remove part of the material of the conductive pillar 24, part of the material of the insulating layer 231 (according to requirements, part of the material of the conductor 232 can be removed at the same time), and part of the material of the cladding layer 25 by grinding.

It should be understood that if the conductors 232 have been exposed from the insulating layer 231, then removing part of the material of the insulating layer 231 can make the conductors 232 exposed from the cladding layer 25 (according to requirements, part of the material of the insulating layer 231 and part of the material of the conductor 232 can also be removed at the same time, so that the conductors 232 are exposed from the cladding layer 25).

Figure 2E:
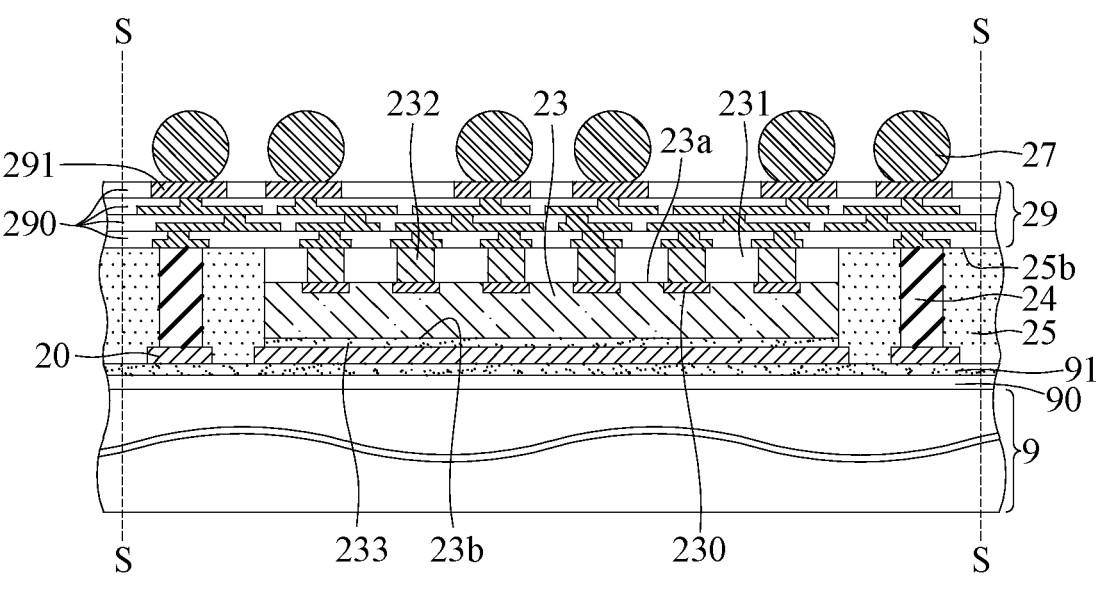

As shown in FIG. 2E, a circuit structure 29 is formed on the second surface 25b of the cladding layer 25, and the circuit structure 29 is electrically connected to the conductive pillars 24 and the conductors 232, so that the electronic element 23 is electrically connected to the circuit structure 29 via the conductors 232.

In an embodiment, the circuit structure 29 includes a plurality of dielectric layers 290 and a plurality of circuit layers 291 (such as of a redistribution layer [RDL] specification) disposed on the dielectric layers 290, and the outermost dielectric layer 290 can be used as a solder-resist layer, so that the outermost circuit layer 291 is exposed from the solder-resist layer. Alternatively, the circuit structure 29 may also only include a single dielectric layer 290 and a single circuit layer 291.

Moreover, the material for forming the circuit layer 291 is such as copper, and the material for forming the dielectric layer 290 is a dielectric material such as polybenzoxazole (PBO), polyimide (PI), prepreg (PP) and the like.

Furthermore, a plurality of conductive elements 27 such as solder balls are formed on the outermost circuit layer 291. For example, an under bump metallurgy (UBM) layer can be formed on the outermost circuit layer 291 to facilitate the bonding of the conductive elements 27.

Figure 2F:
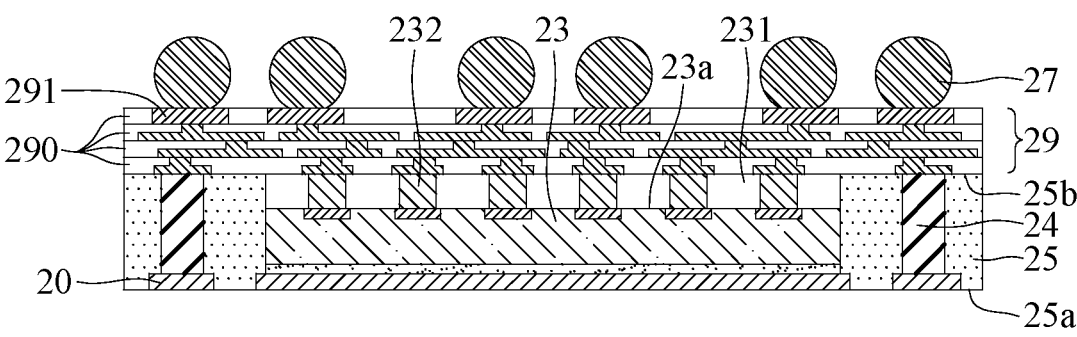

As shown in FIG. 2F, a singulation process is performed along a cutting path S shown in FIG. 2E, and the carrier board 9, the release layer 90 and the bonding layer 91 are removed to expose the first surface 25a of the cladding layer 25 and the routing layer 20.

Figure 2G:
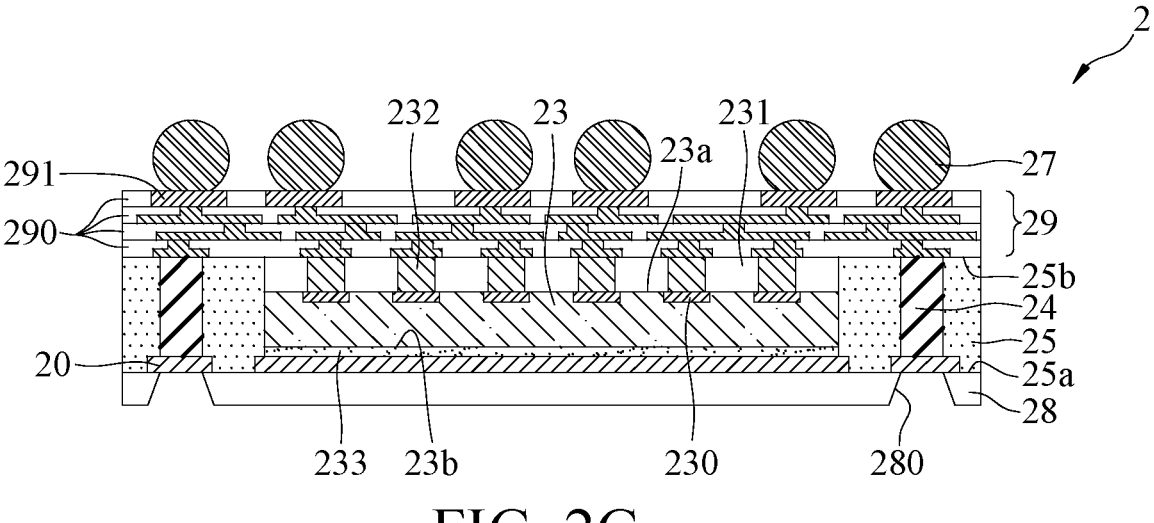

As shown in FIG. 2G, an insulating protection layer 28 as a solder-resist layer is formed on the first surface 25a of the cladding layer 25 and the routing layer 20, and the insulating protection layer 28 has a plurality of openings 280, so that parts of the surface of the routing layer 20 are exposed from the openings 280.

In an embodiment, the material for forming the insulating protection layer 28 is such as polybenzoxazole (PBO), polyimide (PI), prepreg (PP), or other dielectric materials.

Figure 2H:
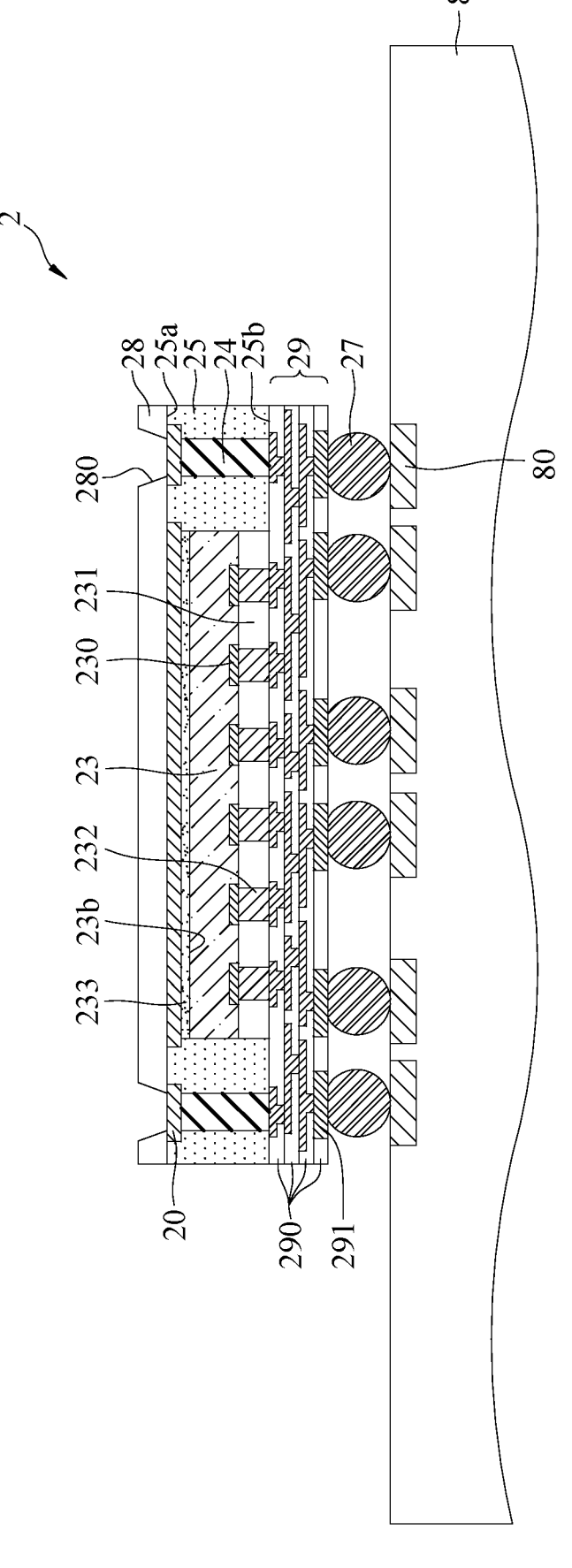
FIG. 2H is a schematic cross-sectional view of the subsequent process of FIG. 2G.

In addition, in the subsequent process, as shown in FIG. 2H, the electronic package 2 can be disposed onto contacts 80 of an electronic device 8 such as a circuit board by reflowing the plurality of conductive elements 27.

Therefore, in the manufacturing method of the present disclosure, the conductive pillars 24 are directly formed on the routing layer 20, so there is no need to perform surface treatment operation on the surface of the routing layer 20, that is, there is no need to carry out conventional processes for increasing the adhesion between the routing layer and the dielectric layer. Therefore, compared with the prior art, the manufacturing method of the present disclosure can simplify the manufacturing process, so as to reduce the manufacturing cost of the electronic package 2.

Furthermore, the manufacturing method of the present disclosure can save the conventional baking time of the dielectric layer because there is no need to form a conventional PI material dielectric layer on the bonding layer 91. Therefore, compared with the prior art, the manufacturing method of the present disclosure can increase the throughput of manufacturing the electronic package 2.

Also, the manufacturing method of the present disclosure does not need to form opening regions because it does not need to form a conventional PI material dielectric layer on the bonding layer 91. Therefore, compared with the prior art, the manufacturing method of the present disclosure can not only reduce the number of times of using the exposure machine used to make the opening regions, so as to reduce the wear and tear of the exposure machine, but also can reduce the cost of the photomask used for exposing the dielectric material, so as to reduce the manufacturing cost of the electronic package 2.

In addition, the manufacturing method of the present disclosure does not need to form a conventional PI material dielectric layer on the bonding layer 91. Therefore, compared with the prior art, the final overall thickness of the electronic package 2 of the present disclosure can be greatly reduced to meet the requirement of thinning.

Further, the manufacturing method of the present disclosure does not need to form a conventional PI material dielectric layer on the bonding layer 91, so that the cladding layer 25 directly covers and contacts the routing layer 20. Therefore, compared with the prior art, the problem of CTE mismatch can be prevented from happening in the cladding layer 25, and thus the occurrence of uneven thermal stress can be avoided. Accordingly, during the thermal cycle (such as reflowing the conductive elements 27), the electronic package 2 will not warp, so that the conductive elements 27 can be effectively aligned with and bonded to the contacts of the electronic device (such as a circuit board) in subsequent processes.

The present disclosure also provides an electronic package 2 comprising: a cladding layer 25, a routing layer 20, a plurality of conductive pillars 24, at least one electronic element 23 and a circuit structure 29.

The cladding layer 25 has a first surface 25a and a second surface 25b opposing the first surface 25a.

The routing layer 20 is embedded in the first surface 25a of the cladding layer 25, so that the outer surface of the routing layer 20 is flush with the first surface 25a of the cladding layer 25.

The conductive pillars 24 are in contact with and bonded on the routing layer 20 and are embedded in the cladding layer 25.

The electronic element 23 is disposed on the routing layer 20 via an adhesive layer 233 and is embedded in the cladding layer 25.

The circuit structure 29 is disposed on the second surface 25b of the cladding layer 25 and is electrically connected to the electronic element 23 and the conductive pillars 24.

In one embodiment, the electronic element 23 has an active surface 23a and an inactive surface 23b opposing the active surface 23a, the electronic element 23 is adhered and fixed on the routing layer 20 via the adhesive layer 233 with the inactive surface 23b thereof, and a plurality of electrode pads 230 are formed on the active surface 23a, so that the circuit structure 29 is electrically connected to the plurality of electrode pads 230. For example, conductors 232 are bonded on the plurality of electrode pads 230, so that the plurality of electrode pads 230 are electrically connected to the circuit structure 29 via the conductors 232. Further, the end surfaces of the conductors 232 are flush with the second surface 25b of the cladding layer 25.

In one embodiment, the end surfaces of the conductive pillars 24 are flush with the second surface 25b of the cladding layer 25.

In one embodiment, the electronic package 2 further comprises a plurality of conductive elements 27 disposed on the circuit structure 29, so that the plurality of conductive elements 27 are electrically connected to the circuit structure 29.

In one embodiment, the electronic package 2 further comprises an insulating protection layer 28 formed on the first surface 25a of the cladding layer 25 and the routing layer 20, and the insulating protection layer 28 has a plurality of openings 280, so that parts of the surface of the routing layer 20 are exposed from the openings 280.

To sum up, in the electronic package and the manufacturing method thereof of the present disclosure, the conductive pillars are directly formed on the routing layer, so there is no need to perform surface treatment operation on the surface of the routing layer, that is, there is no need to carry out conventional processes for increasing the adhesion between the routing layer and the dielectric layer. Therefore, the manufacturing method of the present disclosure can simplify the manufacturing process, so as to reduce the manufacturing cost of the electronic package.

Furthermore, the manufacturing method of the present disclosure can save the conventional baking time of the dielectric layer because there is no need to form a conventional PI material dielectric layer on the carrier board. Therefore, the manufacturing method of the present disclosure can increase the throughput of manufacturing the electronic package.

Also, the manufacturing method of the present disclosure does not need to form opening regions because it does not need to form a conventional PI material dielectric layer on the carrier board. Therefore, the manufacturing method of the present disclosure can not only reduce the number of times of using the exposure machine used to make the opening regions, so as to reduce the wear and tear of the exposure machine, but also can reduce the cost of the photomask used for exposing the dielectric material, so as to reduce the manufacturing cost of the electronic package.

In addition, the manufacturing method of the present disclosure does not need to form a conventional PI material dielectric layer on the carrier board. Therefore, the final overall thickness of the electronic package of the present disclosure can be greatly reduced to meet the requirement of thinning.

Further, the manufacturing method of the present disclosure does not need to form a conventional PI material dielectric layer on the carrier board, so that the cladding layer directly covers and contacts the routing layer. Therefore, the problem of CTE mismatch can be prevented from happening in the cladding layer, and thus the occurrence of uneven thermal stress can be avoided. Accordingly, during the thermal cycle, the electronic package will not warp, so that the conductive elements can be effectively aligned with and bonded to the contacts of the electronic device in subsequent processes.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:

a cladding layer having a first surface and a second surface opposing the first surface;

a routing layer embedded in the first surface of the cladding layer, wherein the routing layer has an outer surface that is flush with the first surface of the cladding layer;

a plurality of conductive pillars in contact with and bonded on the routing layer and embedded in the cladding layer;

an electronic element disposed on the routing layer via an adhesive layer and embedded in the cladding layer, wherein the electronic element has an active surface and an inactive surface opposing the active surface, the electronic element is bonded on the routing layer with the inactive surface via the adhesive layer, a plurality of electrode pads are formed on the active surface, a plurality of conductors are bonded on the plurality of electrode pads, and an insulating layer is formed on the active surface and covering the plurality of electrode pads and the plurality of conductors, wherein the cladding layer covers the insulating layer, and wherein end surfaces of the plurality of conductors are flush with a surface of the insulating layer; and a circuit structure formed on the second surface of the cladding layer and electrically connected to the electronic element and the conductive pillars, and electrically connected to the plurality of electrode pads via the plurality of conductors.

2. The electronic package of claim 1, wherein end surfaces of the plurality of conductors are flush with the second surface of the cladding layer.

3. The electronic package of claim 1, wherein end surfaces of the plurality of conductive pillars are flush with the second surface of the cladding layer.

4. The electronic package of claim 1, further comprising a plurality of conductive elements disposed on and electrically connected to the circuit structure.

5. The electronic package of claim 1, further comprising an insulating protection layer formed on the first surface of the cladding layer and the routing layer, wherein the insulating protection layer has a plurality of openings, and parts of a surface of the routing layer are exposed from the plurality of openings.

6. A method of manufacturing an electronic package, the method comprising:

forming a routing layer on parts of a surface of a carrier board;

forming a plurality of conductive pillars on the routing layer, and disposing an electronic element on the routing layer, wherein the electronic element has an active surface and an inactive surface opposing the active surface, the electronic element is bonded on the routing layer with the inactive surface via an adhesive layer, a plurality of electrode pads are formed on the active surface, a plurality of conductors are bonded on the plurality of electrode pads, and an insulating layer is formed on the active surface and covering the plurality of electrode pads and the plurality of conductors;

forming a cladding layer on the carrier board, wherein the insulating layer, the routing layer, the electronic element and the plurality of conductive pillars are covered by the cladding layer, wherein the cladding layer has a first surface and a second surface opposing the first surface, and the cladding layer is bonded to the carrier board with the first surface, and wherein end surfaces of the plurality of conductors are flush with a surface of the insulating layer;

forming a circuit structure on the second surface of the cladding layer, wherein the circuit structure is electrically connected to the plurality of conductive pillars and the electronic element, and electrically connected to the plurality of electrode pads via the plurality of conductors; and removing the carrier board to expose the first surface of the cladding layer and the routing layer.

7. The method of claim 6, wherein end surfaces of the plurality of conductors are flush with the second surface of the cladding layer.

8. The method of claim 6, wherein end surfaces of the plurality of conductive pillars are flush with the second surface of the cladding layer.

9. The method of claim 6, further comprising forming a plurality of conductive elements on the circuit structure, wherein the plurality of conductive elements are electrically connected to the circuit structure.

10. The method of claim 6, further comprising forming an insulating protection layer on the first surface of the cladding layer and the routing layer, wherein the insulating protection layer has a plurality of openings, and parts of a surface of the routing layer are exposed from the plurality of openings.

* * * * *